United States Patent
Arvin et al.

(10) Patent No.: US 9,679,796 B2
(45) Date of Patent: Jun. 13, 2017

(54) ANODIZED METAL ON CARRIER WAFER

(71) Applicant: International Business Machines Corporation, Armonk, NY (US)

(72) Inventors: Charles L. Arvin, Savannah, GA (US); Harry D. Cox, Rifton, NY (US); Jorge A. Lubguban, Ridgefield, CT (US); Jennifer D. Schuler, Poughquag, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/525,254

(22) Filed: Oct. 28, 2014

(65) Prior Publication Data
US 2016/0118283 A1    Apr. 28, 2016

(51) Int. Cl.
*H01L 21/68* (2006.01)
*H01L 21/683* (2006.01)

(52) U.S. Cl.
CPC ...... *H01L 21/6831* (2013.01); *H01L 21/6835* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC . H01L 2924/01029; H01L 2924/01079; H01L 2924/01013; H01L 2924/14; H01L 2924/01078; H01L 21/68; H01L 21/683; H01L 21/6831; H01L 2221/68318; H01L 2221/68327; H01L 2221/6834; H01L 2221/68381
USPC ........................................................ 257/734
See application file for complete search history.

(56) References Cited

U.S. PATENT DOCUMENTS

| | | | | |
|---|---|---|---|---|
| 2004/0178491 | A1* | 9/2004 | Akram | H01L 21/486 257/686 |
| 2014/0251817 | A1* | 9/2014 | Vais | H01L 31/02167 205/157 |
| 2015/0035173 | A1* | 2/2015 | Dang | B23K 26/36 257/783 |

FOREIGN PATENT DOCUMENTS

| | | |
|---|---|---|
| DE | 102013210850 B3 | 3/2014 |
| WO | 0141191 A2 | 6/2001 |
| WO | 2010121272 A1 | 10/2010 |

\* cited by examiner

*Primary Examiner* — Monica D Harrison
(74) *Attorney, Agent, or Firm* — Anthony Canale; Andrew M. Calderon; Roberts Mlotkowski Safran Cole & Calderon P.C.

(57) ABSTRACT

A method for processing a semiconductor wafer where an electrostatic layer is located on a surface of a handling wafer is used so the surface of the handling wafer may be handled with machinery that uses an electrostatic chuck. The electrostatic layer may be manipulated to increase or decrease the conductivity, and may be removed to allow light to pass through the handling wafer.

19 Claims, 3 Drawing Sheets

ANODIZED METAL ON CARRIER WAFER

BACKGROUND

The present invention relates to wafer debonding and, more specifically, to advanced methods for handling wafer debonding.

Three-dimensional (3D) chip technologies include 3D integrated circuits (IC) and 3D packaging. 3D chip technologies are gaining widespread importance as they allow for greater integration of more complex circuitry with shorter circuit paths allowing for faster performance and reduced energy consumption. In 3D ICs, multiple thin silicon wafer layers are stacked and interconnected vertically to create a single integrated circuit of the entire stack. In 3D packaging, multiple discrete ICs are stacked, interconnected, and packaged together.

Modern techniques for 3D chip technologies, including both 3D ICs and 3D packaging, may utilize through-silicon vias (TSV). A TSV is a vertical interconnect access (VIA) in which a connection passes entirely through a silicon wafer or die. By using TSVs, 3D ICs and 3D packaged ICs may be more tightly integrated as edge wiring and interposer layers are not required.

Temporary wafer bonding/debonding is an important technology for implementing TSVs and 3D silicon structures in general. Bonding is the act of attaching a silicon device wafer, which is to become a layer in a 3D stack, to a substrate or handling wafer so that it can be processed, for example, with wiring, pads, and joining metallurgy, while allowing the wafer to be thinned, for example, to expose the TSV metal of blind vias etched from the top surface.

Debonding is the act of removing the processed silicon device wafer from the substrate or handling wafer so that the processed silicon device wafer may be added to a 3D stack.

BRIEF SUMMARY

An embodiment of the invention may include a method for processing a semiconductor wafer by bonding the semiconductor wafer to a handling wafer using an adhesive and release layer. The handling wafer may have an electrostatic layer covering an exterior surface of a transparent wafer. The method may include processing the semiconductor wafer while it is bonded to the handling wafer. The method may include ablating the adhesive and release layer through the transparent wafer and removing the semiconductor wafer from the handling wafer.

Another embodiment of the invention may include a method for processing a semiconductor wafer by bonding the semiconductor wafer to a handling wafer. The handling wafer may have an electrostatic layer covering a portion of a surface of a transparent wafer. The method may include attaching an electrostatic chuck to the electrostatic layer.

Another embodiment of the invention may include a transparent wafer with an electrostatic layer located on a surface of the transparent wafer. The transparent wafer may be bonded to a device wafer.

BRIEF DESCRIPTION OF THE SEVERAL DRAWINGS

Figure 1:
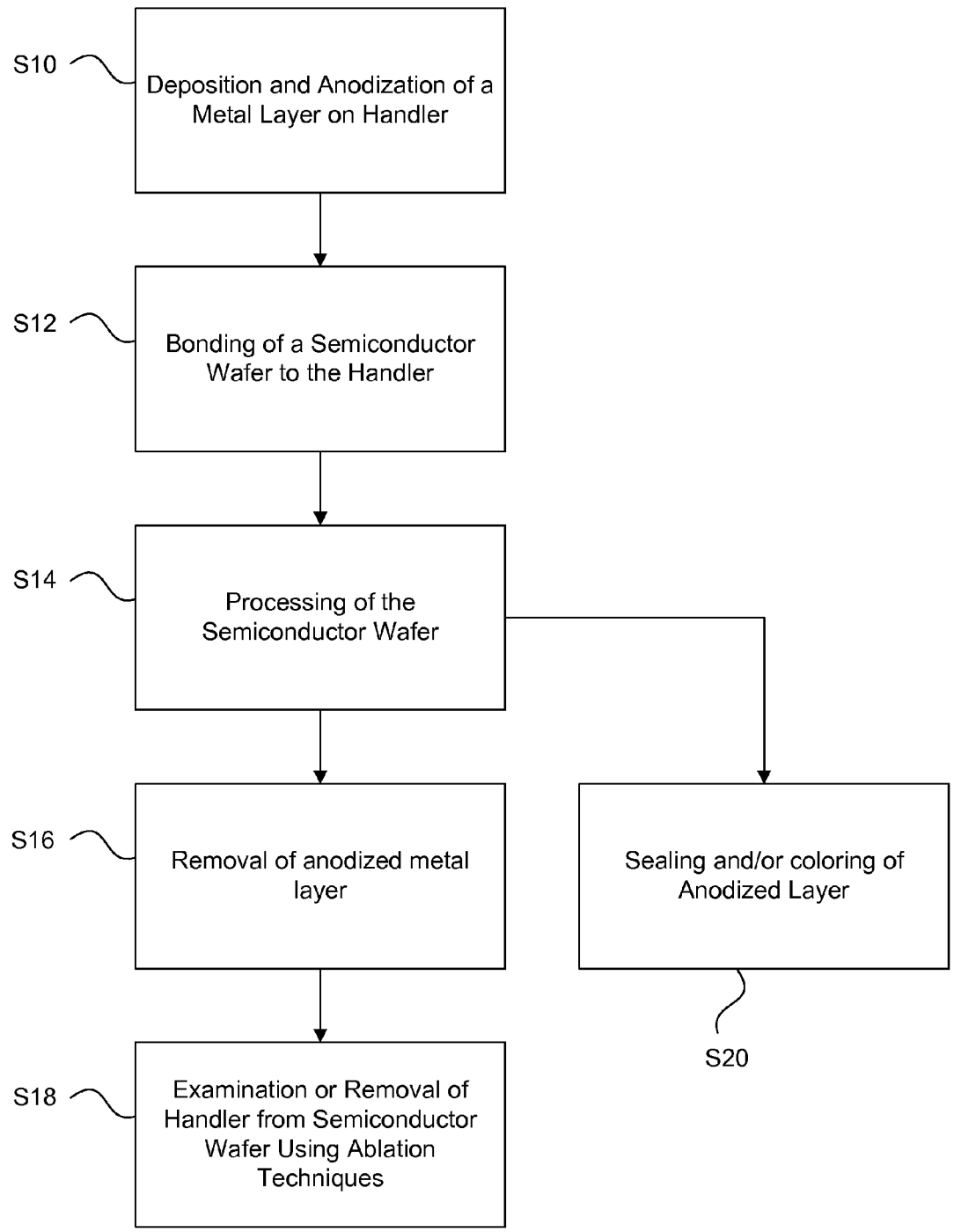
FIG. 1 illustrates a process flow, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention entails bonding of a temporary handling wafer to a semiconductor device wafer to aid in manufacturing and testing. The handling wafer may be used to provide structural support during processing of the semiconductor wafer devices, and the use of a transparent handling wafer may allow for more accurate measurement and testing of the structures and materials on the semiconductor wafer device, as well as allowing the use of laser ablation to separate the handling wafer from the semiconductor device wafer. However, the machinery and robotics used in semiconductor device manufacture often uses optical sensors to detect the position of the semiconductor wafer, and transparent wafers may cause issues for such technology. Further, while techniques exist that allow for marking the surface of a handling wafer, often the removal of such markings requires the use of harsh chemicals (e.g. caustic solutions or aggressive solvents), which may have detrimental impacts on the structures on the semiconductor wafer. Thus, techniques which create an opaque surface to allow for optical detection by processing equipment, while allowing some light to pass through, may have beneficial uses.

Referring now to FIG. 1, a process flow where a handling wafer having an electrostatic layer on the outer surface may be joined to a device wafer, and then the device wafer undergoes typical semiconductor processing. The electrostatic layer may be removed using an acid, or maybe sealed and/or dyed for aftermarket use.

Figure 2A:
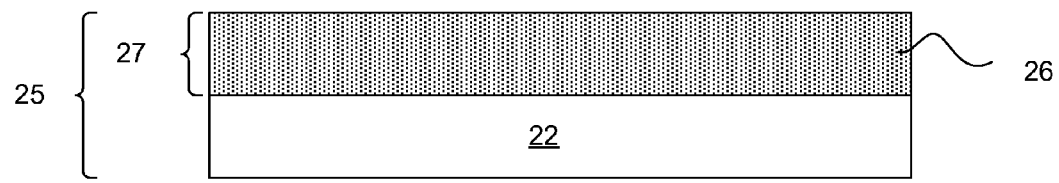
FIG. 2a is a cross-sectional view of a handling wafer coated with metal layer, according to an example embodiment.
Figure 2B:
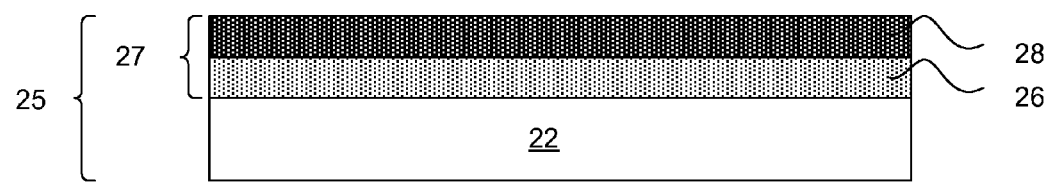
FIG. 2b is a cross-sectional view of a handling wafer coated with partially anodized metal layer, according to an example embodiment.
Figure 2C:
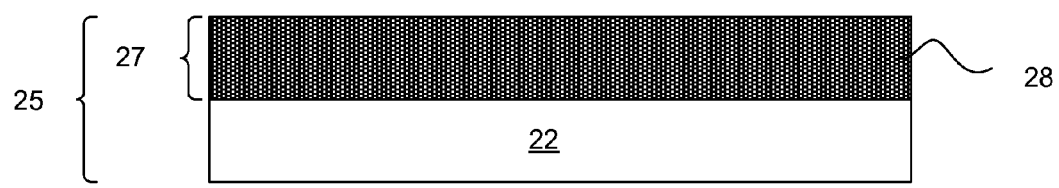
FIG. 2c is a cross-sectional view of a handling wafer coated with fully anodized metal layer, according to an example embodiment.
Figure 3:
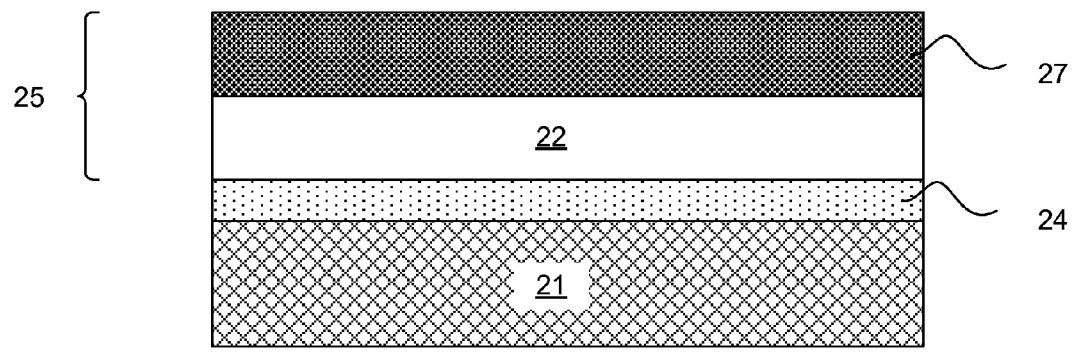
FIG. 3 is a cross-sectional view of a handling wafer coated with an electrostatic layer attached to a device wafer, according to an exemplary embodiment

Referring to step S10 in FIG. 1, as illustrated by FIGS. 2a-2c, a handling wafer 22 may be coated with a metal layer 26 (FIG. 2a). The metal layer 26 may be anodized to form an anodized metal layer 28 (FIGS. 2b & 2c), to create a handling structure 25 capable of attaching with an electrostatic chuck. Deposition and anodization of the metal layer 26 may allow for handling equipment to attach to the wafer using an electrostatic chuck, while creating a surface that reduces the exposure of the various semiconductor processing tools to unwanted metals or chemistries. In an exemplary embodiment, a metal layer 26 may be deposited on the surface of a handling wafer 22 using evaporation, spin coating, sputtering, or any other metal deposition technique known in the art. Examples of materials suitable for the metal layer 26 include, but are not limited to, aluminum, titanium or tantalum. In exemplary embodiments, the metal layer 26 may be 5 to 1000 nm thick depending upon the metal used and the type of anodization to be used.

The handling wafer 22 may be a transparent substrate and may comprise, for example, Borofloat glass. The handling wafer 22 may be sufficiently thick to provide structural integrity to the device wafer 21 bonded thereto. For example, the handling wafer 22 may be approximately 650 µm thick.

Following the deposition of the metal layer 26, the metal layer 26 may be partially anodized (FIG. 2b) or fully anodized (FIG. 2c) based on the metals and parameters of anodization, to create an anodized metal layer 28. Alone, or in combination, the metal layer 26 and the anodized layer 28 create an electrostatic layer 27 that may allow an electrostatic chuck to attach to the handling structure 25. Anodization may be performed in a manner to create porous, or non-porous oxides. Non-porous oxides may be created by placing the handling wafer 22 with the metal layer 26 in an electrolytic solution having a pH from 5-9, and passing a direct current through the solution. In such a method, the metal layer may act as an anode, which may allow for oxygen to be pulled deeper into the material than through simple diffusion. In such methods, the thickness of the resultant oxide depends on the electric potential across the structure. In exemplary embodiments of the present invention, a voltages ranging from 5V up to 300V may create a non-porous anodized layer having a thickness from 10 nm up to 100 s of nm. In other embodiments, porous oxides may be performed by anodizing the metal layer 26 in a low pH solution such as, for example, a liquid having a pH below 4. Such anodization may allow for a thicker anodization layer than non-porous anodidized structures, as the pores in the material decrease the distance oxygen would need to travel to reach a particular portion of the material. In exemplary embodiments of the present invention, anodizing aluminum at a voltage of 5 to 100V in a electrolytic solution having a pH from 4 to 11, may create a non-porous anodized layer having a thickness from 10 to 100 s of nm.

Referring to step S12 in FIG. 1, the handling wafer 22 may be bonded to a device wafer 21. FIG. 4 illustrates the semiconductor structure following the bonding of the handling wafer 22 to the device wafer 21. The device wafer 21 may be a silicon wafer that is to be processed, for example, to be added to a 3D stack such as a layer in a 3D IC or an IC to be included in a 3D package. The device wafer 21 may be processed prior to bonding. However, prior to bonding the device wafer 21 may be a full-thickness wafer. The device wafer 21 may be bonded to the handling wafer 22 to provide structural support during subsequent processing which may include a thinning of the device wafer 21. The device wafer need not be silicon and may instead be composed an alternative semiconductor material, such as, for example, silicon germanium. The device wafer 21 may originate as a full-thickness wafer and may subsequently be thinned down to a size of between approximately 200 um and 20 um.

An adhesive and release layer 24 may be provided between the device wafer 21 and the handling wafer 22. The adhesive and release layer 24 may include a single layer, or may be made up of multiple layers, where each of the layers may contain one or more materials. The adhesive and release layer 24 may adjoin the handling wafer 22 to the device wafer 21 for processing, but be capable of releasing the handling wafer 22 from the device wafer 21 using laser ablation. The adhesive and release layer 24 may be transparent, or sufficiently transparent, to wavelengths of light that would allow for examination of the underlying device wafer 21. According to one exemplary embodiment of the present invention, the adhesive and release layer 24 is deposited directly upon the handling wafer 22. The adhesive and release layer 24 may comprise a material that is highly specialized to absorb strongly near the UV wavelength of laser light used during laser ablation. As exemplary embodiments of the present invention may employ a UV laser, for example, at or near the wavelength 355 nm, the adhesive and release layer 24 may comprise a material highly absorbent of UV light, and in particular, light having a 355 nm wavelength.

The adhesive and release layer 24 may comprise a material that can be laser ablated at the UV wavelength of choice. The adhesive and release layer 24 may be generated, for example, by spin coating or spraying the material for the adhesive and release layer 24 material, for example, onto the handling wafer 22, and then curing the material using heat (e.g. 350° C.) and/or UV light. Curing the material foe the adhesive and release layer 24 may either be performed prior to bonding of the handling wafer 22 to the device wafer 21 or at the same time.

In embodiments where multiple layers are used to create the adhesive and release layer 24, an adhesive layer may be applied to either the device wafer 21 or to a release layer previously applied to the handling wafer 22. The adhesive layer may comprise a distinct material from that which is used as the release layer, and in particular, the adhesive layer may be an adhesive that does not strongly absorb the light of the wavelength that is used to ablate the release layer. The adhesive and release layer 24 may be created, for example, by applying the adhesive material to the device wafer 21. The adhesive and release layer 24 may be cured using heat (e.g. 220° C.).

Referring to step S14 in FIG. 1, processing of the device wafer 21 may occur. Processing may include such process steps as patterning, etching, thinning, etc. until the device wafer has achieved its desired state.

Referring to step S16 in FIG. 1, removal of the metal layer 26 and the anodized metal layer 28 may be performed. Removal of the layers may be performed in order to inspect the device wafer 21 through the transparent handling wafer 22, or in order to use laser ablation to remove the device wafer 21 from the transparent handling wafer 22. Removal of the layers may be performed using any suitable acid. For example, removal of a non-porous tantalum metal layer, with a tantalum oxide anodized metal layer, may be performed using a HF solution. In other examples, a porous aluminum metal layer, having aluminum and an aluminum oxide anodized metal, may be removed using acids having a pH in the range of 2-3 in order to limit damage to the device wafer 21, however a pH as low as 0 may be used to remove the porous aluminum metal layer. In the later example, use of acids with pH in the range described may reduce the likelihood of damage of the device wafer 21, as the acid is less reactive with the components of the device.

Referring to step S18 in FIG. 1, in some embodiments optical inspection may be performed at following the removal of the anodized layer. In the event that optical inspection results in a determination that a defect is present in the device wafer, the device wafer may be rejected on the spot and subsequent processing may be canceled. In other embodiments, optical inspection may include tracking of underfill flow characteristics to analyze process parameters. Because the device wafer may be optically inspected through the handling wafer 22, removal of the device wafer from the handling wafer 22 is not required to perform testing and accordingly, defects may be detected at an earlier stage in processing than would otherwise be possible. Additionally, waiting until the entire 3D stack has been assembled before performing testing may result in the rejection of the entire 3D stack thereby substantially reducing yield and adding substantially to the cost of manufacture. Moreover, seeing the bonded interface through the glass may be useful in that it may be verified that processing has not generated small voids in the bonding adhesive itself, which can lead to yield loss during thinning and vacuum processing. Because defects such as these may be known to exist at early stages of processing, subsequent processing steps performed on the wafer defective may be avoided.

Figure 4A:
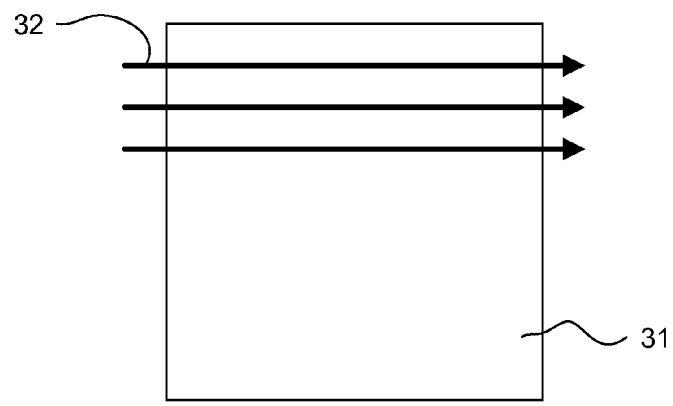
FIG. 4a is a schematic illustration of the pattern of laser ablation, according to an example embodiment.
Figure 4B:
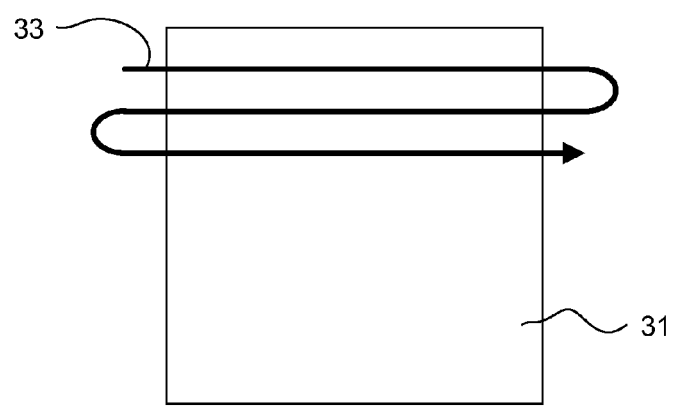
FIG. 4b is a schematic illustration of the pattern of laser ablation, according to an example embodiment.

Referring to step S18 in FIG. 1, debonding of the handling wafer 22 from the device wafer 21 may be performed using laser ablation. The adhesive and release layer 24 may be irradiated though the handling wafer 22, which may be transparent, at least to the wavelength of the laser used. The laser may produce a spot beam that is scanned across the surface of the handling wafer 22, for example, in a raster pattern, or the laser may produce a fan beam that is swept once or multiple times across the handling wafer 22. Directing of the light radiated from the laser may be handled by the use of a scanner and lens, which may be, for example, an F-Theta scan lens having an 810 mm fl. FIGS. 4a and 4b are a schematic diagram illustrating pattern of applying the laser light to a top surface 31 of the handling wafer 22 in accordance with exemplary embodiments of the present invention. As seen in FIG. 4a, the laser light may be directed across the top surface 31 of the handling wafer 22 as a spot beam drawn to lines 32 which move along an x-axis direction of the top surface 31 of the handling wafer 22 with each successive line 32 being drawn lower in the y-axis direction. Alternatively, as seen in FIG. 4b, the laser light may be directed in a serpentine pattern 33.

As the UV wavelength of the laser used may contain relatively high energy, the light may efficiently ablate the adhesive and release layer 24. Once ablated, the device wafer 21 may be freely removed from the handling wafer 22. Thereafter, if necessary, a solvent or cleaning chemical may be used to remove any remaining elements of the adhesive and release layer 24 and/or adhesive and release layer 24 that may remain on the device wafer 21. The debonded and cleaned device wafer 21 may then be further processed, diced and applied to a 3D stack and/or joined to a package or another 3D element.

Referring now to step S20 of FIG. 1, in an alternative process flow the anodized layer 28 may be sealed or dyed following processing. Sealing may be performed by boiling the bonded wafer having a porous anodized layer in a solution having the chemical constituents that are to be added. The desired constituents then fill the pores and the surface of the material, creating a non-porous structure. In some embodiments, the porous anodized layer may be sealed with a chlorofluorocarbon, such as Teflon, solution to create a black, non-conductive layer. In additional embodiments, chromium or magnesium solution may be used to create a conductive oxide. In yet other embodiments, copper may be used to partially fill the pores prior to sealing with chromium or magnesium solutions. In such embodiments, the handling wafer 22 may be left adhered to the device wafer 21, in order to act as a transparent interposer or a transparent board during subsequent semiconductor manufacture. In such embodiments, the adhesive and release layer 24 may be selected without regard to the need to release the handling wafer 22 from the device wafer 21.

It should be appreciated while examples are described with reference to a transparent handling substrate, that other transparent substrates also benefit from the teachings are the invention. For example, glass interposers or substrates would benefit from a film that allows optical detection of the substrate or a film that allows the otherwise non-conductive interposer to be chucked and de-chucked by equipment having electrostatic chucks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for processing a semiconductor wafer comprising:
    bonding a semiconductor wafer to a handling wafer using an adhesive and release layer, wherein the handling wafer comprises an electrostatic layer covering a surface of a transparent handling material;

processing the semiconductor wafer while it is bonded to the handling wafer;

ablating the adhesive and release layer through the transparent handler; and removing the semiconductor wafer from the handling wafer.

2. The method of claim 1, wherein the electrostatic layer is removed prior to ablation.

3. The method of claim 2, wherein the removal of the electrostatic layer is performed using an acid.

4. The method of claim 3, wherein the acid has a pH ranging from about 2 to about 3.

5. The method of claim 1, wherein the electrostatic layer is formed by depositing a metal layer on a surface of the transparent handling material, and then anodizing the metal layer.

6. The method of claim 5, wherein anodizing the metal layer converts at least a portion of the metal layer into a metal oxide.

7. The method of claim 6, wherein the metal is aluminum and the metal oxide is aluminum oxide.

8. A method for processing a semiconductor wafer comprising:

bonding a semiconductor wafer to a handling wafer, wherein the handling wafer comprises an electrostatic layer covering a surface of a transparent wafer; and attaching an electrostatic chuck to the electrostatic layer covering the surface of the handling wafer.

9. The method of claim 8, wherein the electrostatic layer is formed by depositing a metal layer on a surface of the transparent handling material, and then anodizing the metal layer.

10. The method of claim 9, wherein anodizing the metal layer converts at least a portion of the metal layer into a metal oxide.

11. The method of claim 10, wherein the metal layer is aluminum and the metal oxide is aluminum oxide.

12. The method of claim 9, wherein the anodized metal layer is sealed or dyed.

13. A semiconductor structure comprising:

a transparent wafer;

an electrostatic layer located on a surface of the transparent wafer; and a device wafer bonded to the transparent wafer;

wherein the electrostatic layer comprises a layer of metal, and a separate layer of an anodized component of the metal.

14. The structure of claim 13, wherein the metal is aluminum and the electrostatic layer is capable of attaching to an electrostatic chuck.

15. The structure of claim 13, wherein the electrostatic layer is porous.

16. The structure of claim 15, wherein at least one pore in the porous electrostatic layer is filled with a non-conductive material.

17. The structure of claim 16, wherein the non-conductive material is a chlorofluorocarbon.

18. The structure of claim 16, wherein at least one pore in the porous electrostatic layer is filled with a conductive material.

19. The structure of claim 18, wherein the conductive material comprises chromium, magnesium, or a combination thereof.

* * * * *